(12) United States Patent
Seo et al.

(10) Patent No.: US 8,519,616 B2
(45) Date of Patent: Aug. 27, 2013

(54) ORGANIC ELECTROLUMINESCENT DISPLAY DEVICE AND METHOD OF FABRICATING THE SAME

(75) Inventors: Chang-Ki Seo, Gyeongsangbuk-do (KR); Jong-Woo Park, Daegu (KR); Mi-Youn Yang, Seoul (KR); Kyung-Tak Oh, Gyeongsangbuk-do (KR); Dae-Sick Cho, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/555,985

(22) Filed: Jul. 23, 2012

(65) Prior Publication Data

US 2012/0286655 A1    Nov. 15, 2012

Related U.S. Application Data

(62) Division of application No. 12/837,990, filed on Jul. 16, 2010, now Pat. No. 8,251,766.

(30) Foreign Application Priority Data

Jul. 17, 2009    (KR) .................. 10-2009-0065190

(51) Int. Cl.
*H05B 33/00*    (2006.01)
(52) U.S. Cl.
USPC ...................... 313/504; 313/292; 313/506
(58) Field of Classification Search
None
See application file for complete search history.

(56) References Cited

U.S. PATENT DOCUMENTS

| | | | | |
|---|---|---|---|---|
| 7,626,328 B2 * | 12/2009 | Lee et al. | ...................... | 313/504 |
| 2003/0199144 A1 | 10/2003 | Atobe et al. | | |
| 2004/0227459 A1 | 11/2004 | Imura | | |
| 2005/0046344 A1 | 3/2005 | Lee et al. | | |
| 2005/0064622 A1 | 3/2005 | Atobe et al. | | |
| 2006/0001041 A1 | 1/2006 | Peng | | |
| 2006/0097633 A1 | 5/2006 | Cho et al. | | |
| 2006/0132034 A1 | 6/2006 | Cho et al. | | |
| 2007/0013292 A1 | 1/2007 | Inoue et al. | | |
| 2007/0295962 A1 | 12/2007 | Choi et al. | | |
| 2008/0136316 A1 | 6/2008 | Um | | |
| 2010/0308720 A1 | 12/2010 | Lee | | |

OTHER PUBLICATIONS

Chinese Office Action and English translation dated Sep. 26, 2012, issued in corresponding Chinese Patent Application No. 201010188863.8.

* cited by examiner

*Primary Examiner* — Ashok Patel
(74) *Attorney, Agent, or Firm* — Morgan, Lewis & Bockius LLP

(57) ABSTRACT

A method for fabricating an organic electroluminescent display device including the steps of preparing first and second substrates, forming an organic electroluminescent display on the first substrate, forming a first etching mask film on an upper surface of the second substrate, forming a second etching mask film on a lower surface of the second substrate, performing a first etching process on the upper surface of the second substrate, forming a third etching mask film on an etched portion of the second surface of the glass substrate, performing a second etching process on the upper surface of the second substrate to form a plurality of grooves on the upper surface of the second substrate, removing the first and second etching mask films, the second etching film remaining on the etched portion of the second surface of the glass substrate, and encapsulating the organic electroluminescent display between the first and second substrates.

7 Claims, 13 Drawing Sheets

ORGANIC ELECTROLUMINESCENT DISPLAY DEVICE AND METHOD OF FABRICATING THE SAME

The present application is a divisional application of U.S. patent application Ser. No. 12/837,990 filed on Jul. 16, 2010 now U.S. Pat. No. 8,251,766, which claims the benefit of Korean Patent Application No. 10-2009-0065190 filed in Korea on Jul. 17, 2009, which are both hereby incorporated by reference in their entirety.

BACKGROUND OF THE INVENTION

1. Field of the Invention

The present invention relates to an organic electroluminescent display (ELD) device, and more particularly, to an organic electroluminescent display device where deterioration due to bending and protrusion is prevented and a method of fabricating the same.

2. Discussion of the Related Art

Among flat panel displays (FPDs), organic ELD devices have been of particular interest in research and development because they have high brightness and low driving voltage. For example, since the organic ELD devices are driven with a low voltage of between DC 5V and DC 15V, a driving circuit may be easily designed and fabricated. In addition, since organic ELD devices are an emissive type, organic ELD devices have a high contrast ratio and a thin profile. Also, organic ELD devices can display images without viewing angle limitations. Further, since organic ELD devices have a short response time of several microseconds (μs), the organic ELD devices have a stable operation property at a low temperature and an advantage in displaying moving images.

Organic ELD devices may be classified into a passive matrix type and an active matrix type according to existence of a switching element. In a passive matrix type organic ELD device where a scan line and a signal line that cross each other to define a pixel region are disposed in a matrix without a switching element, the light of each pixel region may have an instant brightness obtained by multiplying a required average brightness and the number of the scan line since each pixel region emits light only while the corresponding scan line is selected.

In an active matrix type organic ELD device where a scan line and a signal line that cross each other to define a pixel region are disposed in a matrix and a thin film transistor (TFT) as a switching element and a storage capacitor are disposed in each pixel region, the light of each pixel region may have an instant brightness corresponding to a required average brightness since a voltage applied to each pixel region is maintained during a frame due to the TFT and the storage capacitor. As a result, the active matrix organic ELD device may have the required average brightness even with a relatively low voltage as compared with the passive matrix organic ELD device. Accordingly, the active matrix organic ELD device has been widely used due to the advantages of low power consumption, high resolution, and large size.

FIG. 1 is a circuit diagram showing an active matrix type organic ELD device according to the related art. In FIG. 1, a pixel region P of an active matrix type organic ELD device includes a switching thin film transistor (STr), a driving thin film transistor (DTr), a storage capacitor StgC, and an organic electroluminescent diode E. A gate line GL is disposed along a first direction, and a data line DL is disposed along a second direction crossing the first direction. The gate line GL and the data line DL cross each other to define the pixel region P. A power line PL is parallel to and spaced apart from one of the gate line GL and the data line DL. The switching TFT STr is connected to the gate line GL and the data line DL, and the driving TFT DTr is electrically connected to the switching TFT STr. In addition, the driving TFT DTr is electrically connected to the organic electroluminescent diode E and the power line PL. For example, a first electrode of the organic electroluminescent diode E may be connected to a drain electrode of the driving TFT DTr, and a source voltage of the power line PL is transmitted to the organic electroluminescent diode E through the driving TFT DTr. The storage capacitor StgC is formed between a gate electrode and a source electrode of the driving TFT DTr.

When a gate signal is applied to the gate line GL, the switching TFT STr is turned on and a data signal of the data line DL is applied to the gate electrode of the driving TFT DTr. As a result, the driving TFT DTr is turned on and light is emitted from the organic electroluminescent diode E. The grey level of the light emitted from the organic electroluminescent diode E is determined according to the intensity of a current flowing from the power line PL to the organic electroluminescent diode E through the driving TFT DTr. Since the storage capacitor StgC keeps the voltage of the gate electrode of the driving TFT DTr constant while the switching TFT STr is turned off, the constant current flows through the organic electroluminescent diode E during a frame even when the switching TFT STr is turned off.

FIG. 2 is a cross-sectional view showing an organic electroluminescent display device according to the related art. In FIG. 2, an organic ELD device includes first and second substrates 3 and 31 facing each other. The first substrate 3 includes glass and the second substrate 31 is used for encapsulation. A boundary portion of the first and second substrates 3 and 31 is sealed with a seal pattern 40. A driving thin film transistor DTr and a first electrode 12 are formed in each pixel region P on the first substrate 3, and the first electrode 12 is connected to the driving TFT DTr. An organic luminescent layer 14 is formed on the first electrode 12, and a second electrode 16 is formed on the organic luminescent layer 14. The organic luminescent layer 14 includes red, green, and blue emitting material patterns 14a, 14b and 14c emitting red, green, and blue lights, respectively, and the second electrode 16 is formed on the red, green, and blue emitting material patterns 14a, 14b and 14c. An electric field generated between the first and second electrodes 12 and 16 is applied to the organic luminescent layer 14, and the first electrode 12, and the second electrode 16 constitute an organic electroluminescent diode E.

The first and second substrates 3 and 31 are attached to each other by the seal pattern 40, and the second electrode 16 over the first substrate 3 is spaced apart from the second substrate 31. The second substrate 31 includes a groove GR on an inner surface thereof, and an absorbent material 32 such as barium oxide (BaO) or calcium oxide (CaO) is formed in the groove GR to prevent moisture penetration from the exterior. Since the organic luminescent layer 14 deteriorates from exposure to oxygen or moisture, the first substrate 3 including the organic luminescent layer 14 is encapsulated by the second substrate 31 including the absorbent material 32 so that penetration of oxygen or moisture can be prevented.

The absorbent material 32 has a thickness t within a range of about 150 μm to about 250 μm, and the first and second substrates 3 and 31 have a gap distance within a range of about 6 μm to about 12 μm using a glass fiber (not shown) or a spacer (not shown). To keep the gap distance within a range of about 6 μm to about 12 μm, the groove GR having a depth greater than the thickness of the absorbent material 32 is formed in the second substrate 31 and the absorbent material 32 is formed in the groove GR.

When the first and second substrates 3 and 31 are formed to be spaced apart from each other by a gap distance greater than about 150 μm using a thick glass fiber or a thick spacer, the waste of material increases and the thickness of the organic ELD device increases. In addition, since the thick glass fiber or the thick spacer is vulnerable to external impact, the reliability of the organic ELD device is reduced. Further, since a thickness of the seal pattern 40 increases, an area exposed to the exterior increases and penetration of oxygen or moisture increases. Accordingly, the groove GR is formed in the second substrate 31 and the absorbent material 32 is formed in the groove GR.

However, since the groove GR is formed in the second substrate 31, the thickness of the second substrate 31 corresponding to the groove GR is reduced and the second substrate 31 having a reduced thickness is vulnerable to external impact. For example, the second substrate 31 may be broken or cracked during one of the steps of forming the absorbent material 32 in the groove GR, attaching the first and second substrates 3 and 31, or transferring the second substrate 31. In addition, the groove GR is formed to correspond to a display area of the second substrate 31 and the absorbent material 32 is formed in the groove GR. As a result, light of the organic electroluminescent diode E cannot be emitted through the second substrate 32 and the organic ELD device cannot be applied to an upper emission type.

SUMMARY OF THE INVENTION

Accordingly, the present invention is directed to an organic electroluminescent display device and a method of fabricating the same that substantially obviate one or more of the problems due to limitations and disadvantages of the related art.

An object of the present invention is to provide an organic ELD device including an encapsulation substrate and a method of fabricating the organic ELD device.

Another object of the present invention is to provide an organic ELD device applicable to an upper emission type and a method of fabricating the organic ELD device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, the organic electroluminescent display device and method of fabricating the same includes a method for fabricating an organic electroluminescent display device including the steps of preparing first and second substrates, forming an organic electroluminescent display on the first substrate, forming a first etching mask film on an upper surface of the second substrate, forming a second etching mask film on a lower surface of the second substrate, performing a first etching process on the upper surface of the second substrate, forming a third etching mask film on an etched portion of the second surface of the glass substrate, performing a second etching process on the upper surface of the second substrate to form a plurality of grooves on the upper surface of the second substrate, removing the first and second etching mask films, the second etching film remaining on the etched portion of the second surface of the glass substrate, and encapsulating the organic electroluminescent display between the first and second substrates.

In another aspect, the organic electroluminescent display device and method of fabricating the same includes a method for fabricating an organic electroluminescent display device including the steps of preparing first and second substrates, forming an organic electroluminescent display on the first substrate, forming a first etching mask film on an upper surface of the second substrate, forming a second etching mask film on a lower surface of the second substrate, performing a first etching process on the upper surface of the second substrate, forming a third etching mask film on an etched portion of the second surface of the glass substrate, performing a second etching process on the upper surface of the second substrate to form a plurality of grooves on the upper surface of the second substrate, removing the first, second, and third etching mask films, forming a first insulating material layer on the entire upper surface of the second substrate, removing end portions of the first insulating layer, the first insulating layer remaining on the etched portion of the second surface of the glass substrate, and encapsulating the organic electroluminescent display between the first and second substrates.

In another aspect, the organic electroluminescent display device and method of fabricating the same includes a method of fabricating an organic electroluminescent display device, including the steps of forming an organic electroluminescent diode on a first substrate including a display area and a non-display area surrounding the display area, forming a first etching mask film on first and second surfaces of a second substrate including a first region corresponding to the non-display area, a second region corresponding to the display area and a third region between the first and second region, the first etching mask film disposed in the first region of the first surface and in the first, second and third regions of the second surface, etching the second substrate using the first etching mask film as an etching mask so that the second substrate of the first region has a first thickness and the second substrate of the second and third regions has a second thickness smaller than the first thickness, forming a second etching mask film on the first surface, the second etching mask film disposed in the second region of the first surface and in portions of the third region of the first surface, and other portions of the third region of the first surface exposed through the second etching mask film, etching the second substrate using the first and second etching mask films to form a plurality of grooves corresponding to the other portions of the third region, the second substrate corresponding to the plurality of grooves having a third thickness smaller than the second thickness, removing the first etching mask film on the first and second surfaces, forming an absorbent material in the plurality of grooves, and attaching the first and second substrates such that the organic electroluminescent diode faces the first surface.

In another aspect, the organic electroluminescent display device and method of fabricating the same includes an organic electroluminescent display device including a first substrate including a display area and a non-display area surrounding the display area, an organic electroluminescent diode in the display area on the first substrate, a second substrate facing and spaced apart from the first substrate, the second substrate including a first region corresponding to the non-display area, a second region corresponding to the display area and a third region between the first and second region, wherein the second substrate includes a plurality of grooves in the third region, and wherein the second substrate has a first thickness in the first region, a second thickness smaller than the first thickness in the second region and a third thickness smaller than the second thickness in a portion of the third region where the plurality of grooves are formed, a protection layer in the second region on the second substrate, and a seal pattern in the first region between the first and second substrates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
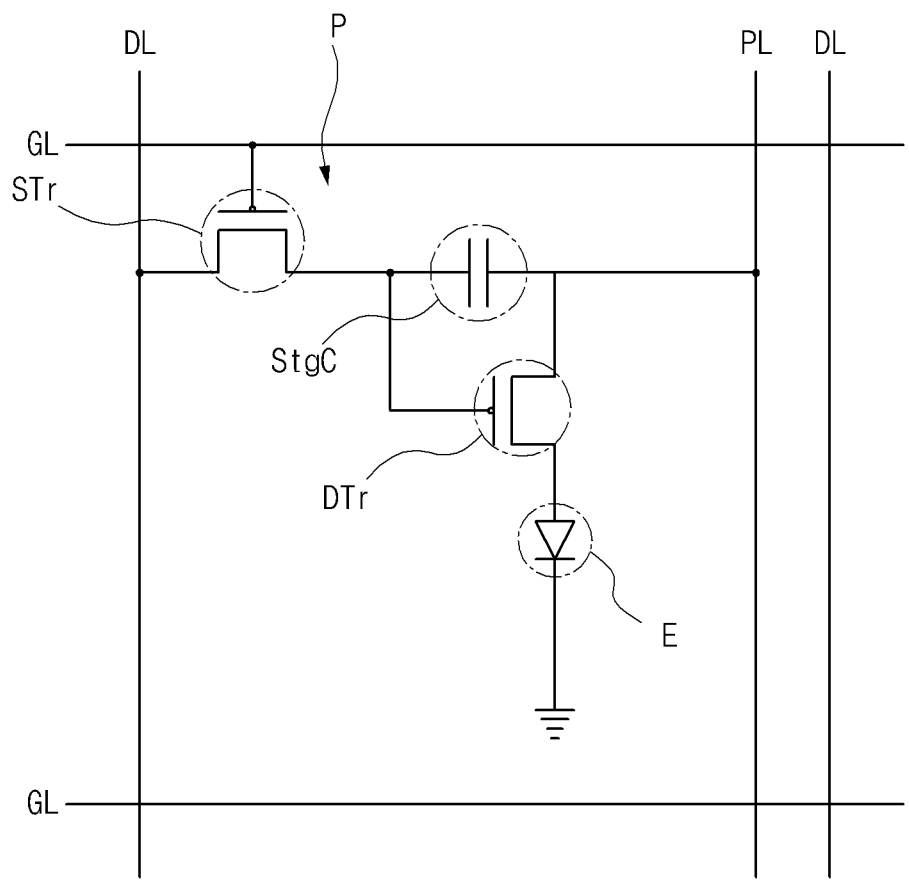
FIG. 1 is a circuit diagram showing an active matrix type organic ELD device according to the related art.
Figure 2:
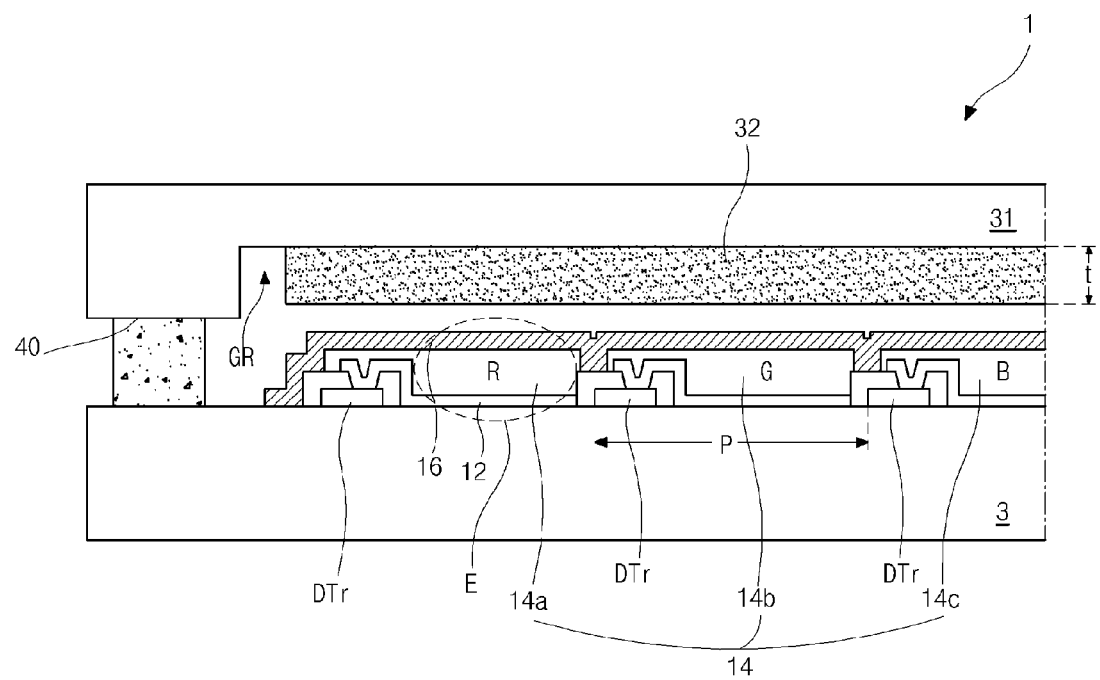
FIG. 2 is a cross-sectional view showing an organic ELD device according to the related art.
Figure 3:
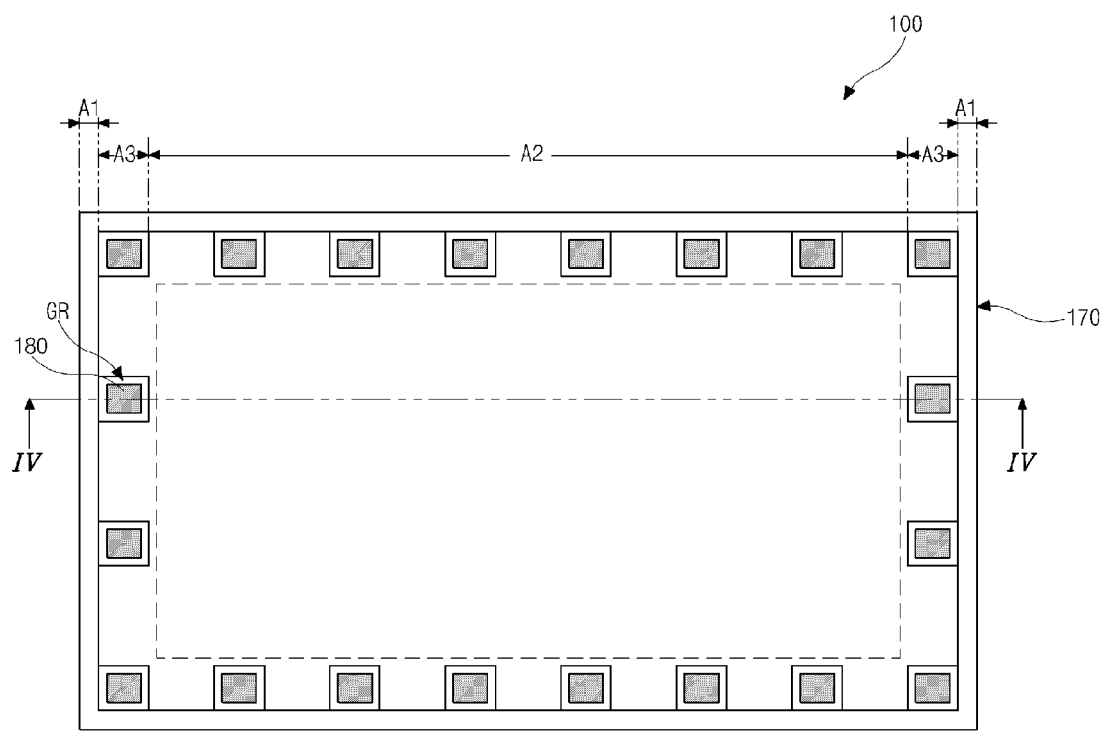
FIG. 3 is a plane view showing an organic ELD device according to an exemplary first embodiment of the present invention.
Figure 4:
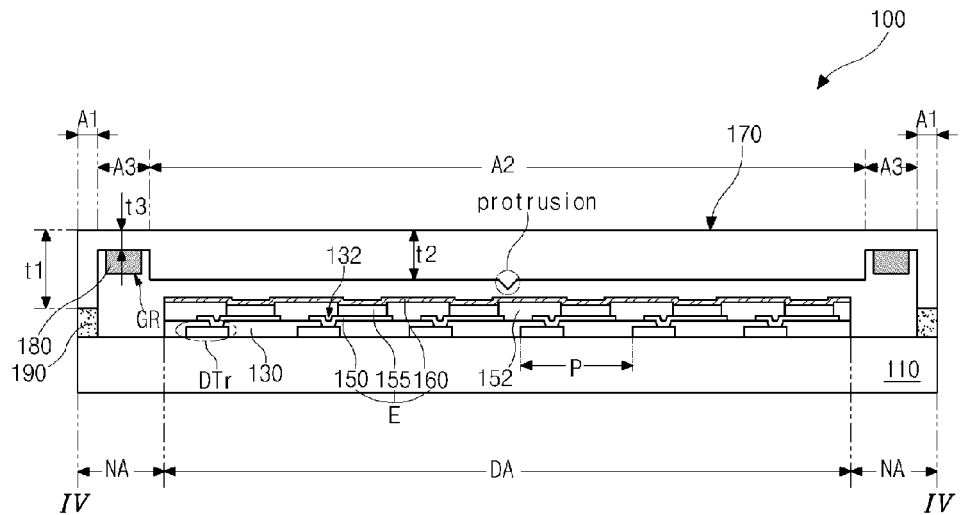
FIG. 4 is a cross-sectional view taken along a line IV-IV of FIG. 3.

FIG. 3 is a plane view showing an organic electroluminescent display device according to an exemplary first embodiment of the present invention, and FIG. 4 is a cross-sectional view taken along a line IV-IV of FIG. 3.

In FIGS. 3 and 4, an organic ELD device 100 includes a first substrate 110 having a switching TFT (not shown), a driving thin film transistor (TFT) DTr and an organic electroluminescent diode E, and a second substrate 170 facing the first substrate 110. The second substrate 170 is used for encapsulating the first substrate 110. The first substrate 110 includes a display area DA and a non-display area NA surrounding the display area DA. A plurality of gate lines (not shown), a plurality of data lines, and a plurality of power lines (not shown) are formed in the display area DA on the first substrate 110. The plurality of gate lines cross the plurality of data lines to define a plurality of pixel regions P, and the plurality of power lines are spaced apart from the plurality of gate lines or the plurality of data lines. In addition, the switching TFT connected to the gate and data line, the driving TFT DTr connected to the switching TFT STr, and the power line are formed in each pixel region P. A passivation layer 130 having a flat top surface is formed on the switching TFT STr and the driving TFT DTr, and a first electrode 150 is formed on the passivation layer 130 in each pixel region P. The passivation layer 130 includes a contact hole 132 exposing an electrode of the driving TFT DTr, and the first electrode 150 is connected to the electrode of the driving TFT DTr through the contact hole 132.

Further, a buffer pattern 152 is formed on the first electrode 150 at a boundary portion of each pixel region P. The buffer pattern 152 covers and overlaps edge portions of the first electrode 150. An organic luminescent layer 155 is formed on the first electrode 150 inside the buffer pattern 152, and a second electrode 160 is formed on the organic luminescent layer 155. The second electrode 160 may be formed in the whole display area DA as a single body. The first electrode 150, the organic luminescent layer 155, and the second electrode 160 constitute the organic electroluminescent diode E.

Elements such as link lines (not shown) and pads for connection to an external driving circuit (not shown) are formed in the non-display area NA of the first substrate 110. Although the passivation layer 130 is removed in the non-display area NA for improving contact property in FIGS. 3 and 4, the passivation layer 130 may remain in the non-display area NA for protecting the elements such as the link lines.

The second substrate 170 includes a first region A1 corresponding to the non-display area NA, a second region A2 surrounded by the first region A1 and a third region A3 between the first and second regions A1 and A2. The second substrate 170 may include a transparent glass. The first region A1 of the second substrate 170 that is not etched may have a first thickness t1, and the second region A2 of the second substrate 170 that is etched once may have a second thickness t2 smaller than the first thickness t1. A plurality of grooves GR is formed in the third region A3 of the second substrate 170. In addition, the third region A3 of the second substrate 170 corresponding to the plurality of grooves GR may have a third thickness t3 smaller than the second thickness t2 and the other portions of the third region A3 may have the second thickness t2. The plurality of grooves GR may be uniformly spaced apart from each other by a predetermined distance. An absorbent material 180 such as barium oxide (BaO) or calcium oxide (CaO) are formed in each of the plurality of grooves GR of the third region A3 of the second substrate 170.

The first and second substrates 110 and 170 are attached with a seal pattern 190 such that the display area DA of the first substrate 110 faces the second region A2 of the second substrate 170. The seal pattern 190 is formed between the first and second substrates 110 and 170 in the first region A1.

In the organic electroluminescent display device 100 according to the first exemplary embodiment of the present invention, deterioration such as breaks or cracks due to external impact are prevented since the second substrate 170 has the second thickness t2 greater than the third thickness t3 in the second region A2 corresponding to the display area DA. Further, the second substrate 170 has the third thickness t3 in the plurality of grooves GR of the third region A3. Deterioration due to the external impact is reduced since the plurality grooves GR are disposed to be spaced apart from each other and portions having the first or second thickness t1 or t2 surround each of the plurality of grooves GR.

As a size of an organic ELD device increases, a display area of the organic ELD device increases. In addition, as the display area of the organic eELD device increases, deterioration due to the bending of a second substrate may increase.

Figure 5:
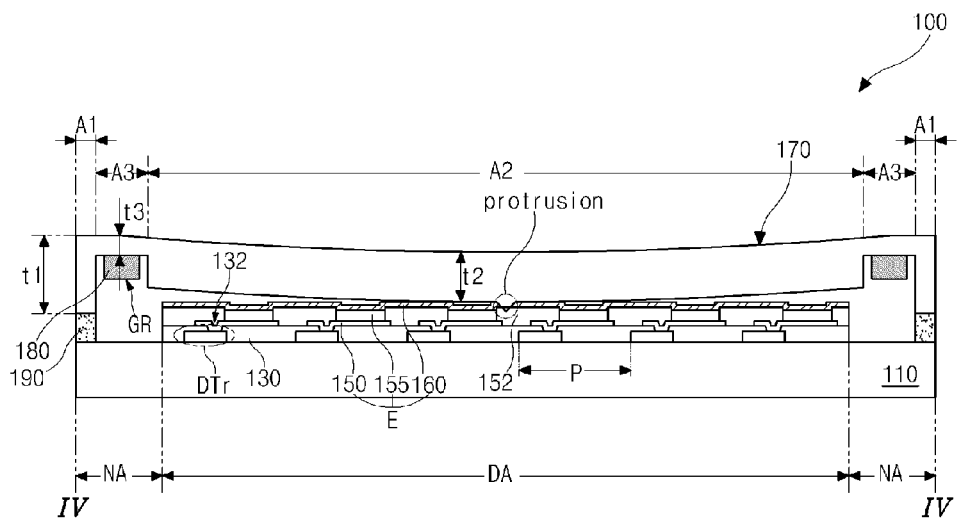
FIG. 5 is a cross-sectional view showing bending of a second substrate of an organic ELD device according to an exemplary first embodiment of the present invention.

FIG. 5 is a cross-sectional view showing bending of a second substrate of an organic ELD device according to an exemplary first embodiment of the present invention.

In FIG. 5, a second substrate 170 having a relatively large size is bent even by a relatively small external force. Although a gap distance between the first substrate 110 in the display area DA and the second substrate 170 in the second region A2 is several micrometers, the second substrate 170 contacts the second electrode 160 of the first substrate 110 due to the bending of the second substrate 170. When the second substrate 170 has a flat inner surface, the organic ELD device 100 is not deteriorated by the bending of the second substrate 170 because the second electrode 160 is formed of a metallic material. However, a protrusion having a height of about 1 μm to about 3 μm may be formed on the inner surface of the second substrate 170 of the second region A2 since the second substrate 170 of the second and third regions A2 and A3 is etched with an etching solution such as hydrofluoric acid (HF) to have the second and third thicknesses t2 and t3, respectively. When the second substrate 170 of the second region A2 is bent to contact the second electrode 160 of the first substrate 110, the second electrode 160 may be broken by the protrusion, or the first and second electrodes 150 and 160 may be electrically connected by the protrusion. As a result, the display quality of the organic ELD device 100 is deteriorated. Although deterioration due to contact of the protrusion is prevented by further etching the second substrate 170 of the second region A2, the second substrate 170 of the second region A2 may be easily cracked or broken due to a reduced thickness.

Figure 6:
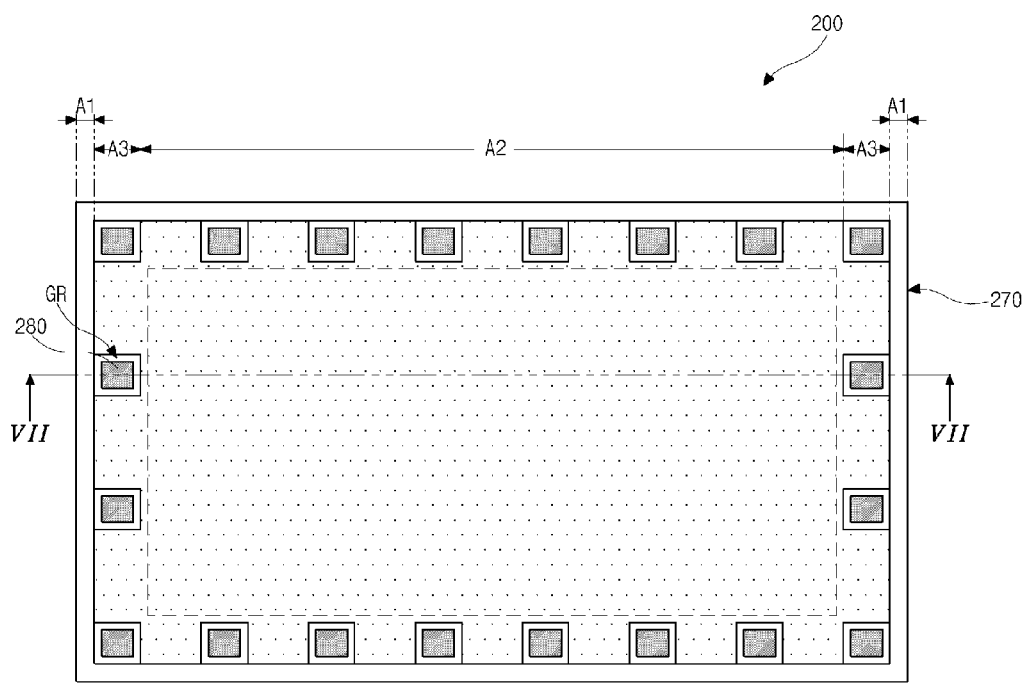
FIG. 6 is a plane view showing an organic ELD device according to an exemplary second embodiment of the present invention.
Figure 7A:
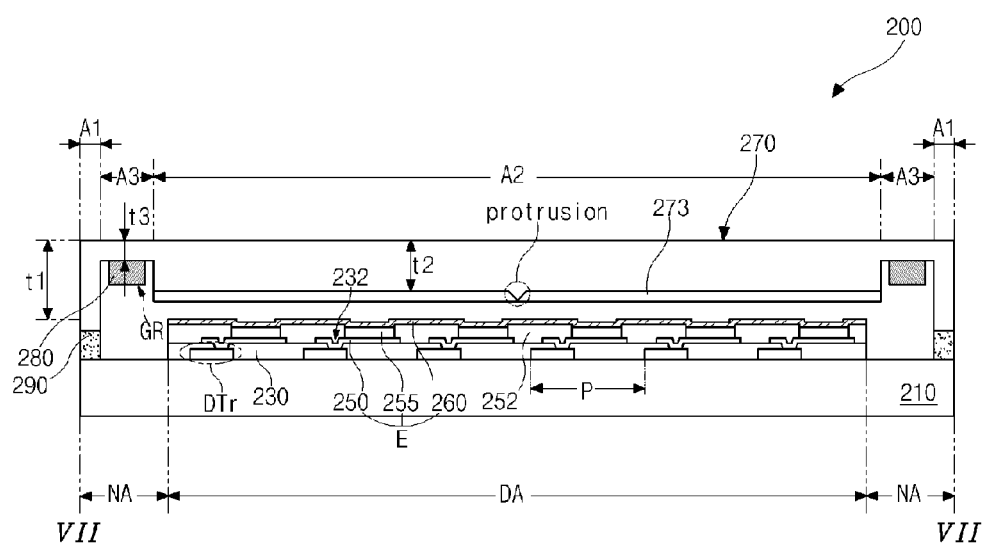
FIG. 7A is a cross-sectional view taken along a line VII-VII of FIG. 6.

FIG. 6 is a plane view showing an organic ELD device according to an exemplary second embodiment of the present invention. FIG. 7A is a cross-sectional view taken along a line VII-VII of FIG. 6 and FIG. 7B is a cross-sectional view showing bending of a second substrate of an organic ELD device according to an exemplary second embodiment of the present invention.

Figure 7B:
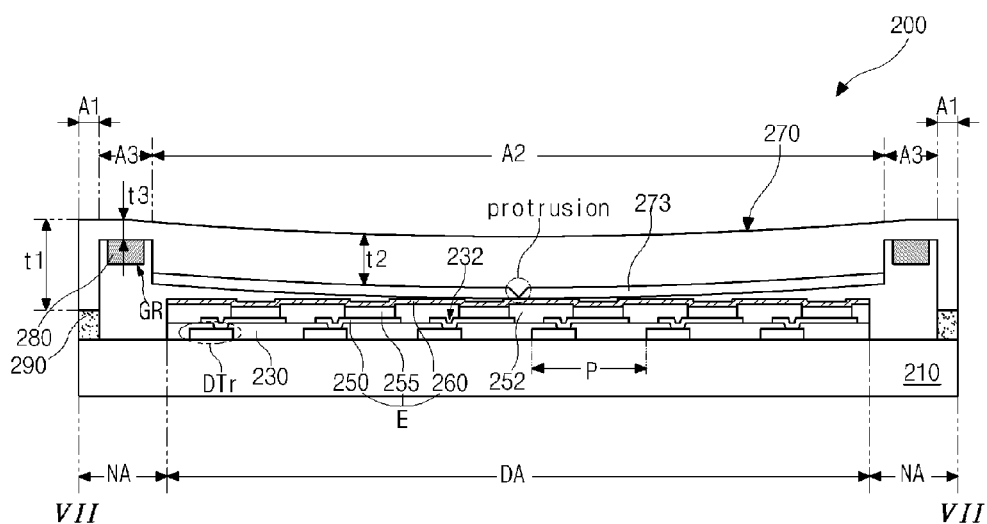
FIG. 7B is a cross-sectional view showing bending of a second substrate of an organic ELD device according to an exemplary second embodiment of the present invention.

In FIGS. 6, 7A, and 7B, an organic ELD device 200 includes a first substrate 210 having a switching TFT (not shown), a driving thin film transistor (TFT) DTr, an organic electroluminescent diode E, and a second substrate 270 facing the first substrate 210. The second substrate 270 is used for encapsulating the first substrate 210. The first substrate 210 includes a display area DA and a non-display area NA surrounding the display area DA. A plurality of gate lines (not shown), a plurality of data lines, and a plurality of power lines (not shown) are formed in the display area DA on the first substrate 210. The plurality of gate lines cross the plurality of data lines to define a plurality of pixel regions P, and the plurality of power lines are spaced apart from the plurality of gate lines or the plurality of data lines. In addition, the switching TFT connected to the gate and data line, the driving TFT DTr connected to the switching TFT STr, and the power line are formed in each pixel region P. A passivation layer 230 having a flat top surface is formed on the switching TFT STr and the driving TFT DTr, and a first electrode 250 is formed on the passivation layer 230 in each pixel region P. The passivation layer 230 includes a contact hole 232 exposing an electrode of the driving TFT DTr, and the first electrode 250 is connected to the electrode of the driving TFT DTr through the contact hole 232.

Further, a buffer pattern 252 is formed on the first electrode 250 at a boundary portion of each pixel region P. The buffer pattern 252 covers and overlaps edge portions of the first electrode 250. An organic luminescent layer 255 is formed on the first electrode 250 inside the buffer pattern 252, and a second electrode 260 is formed on the organic luminescent layer 255. The second electrode 260 may be formed in the whole display area DA as a single body. The first electrode 250, the organic luminescent layer 255, and the second electrode 260 constitute the organic electroluminescent diode E.

Elements such as link lines (not shown) and pads for connection to an external driving circuit (not shown) are formed in the non-display area NA of the first substrate 210. Although the passivation layer 230 is removed in the non-display area NA for improving contact property in FIGS. 6, 7A and 7B, the passivation layer 230 may remain in the non-display area NA for protecting the elements such as the link lines.

The second substrate 270 includes a first region A1 corresponding to the non-display area NA, a second region A2 surrounded by the first region A1, and a third region A3 between the first and second regions A1 and A2. The second substrate 270 may include a transparent glass. The first region A1 of the second substrate 270 that is not etched may have a first thickness t1, and the second region A2 of the second substrate 270 that is etched once may have a second thickness t2 smaller than the first thickness t1. A plurality of grooves GR is formed in the third region A3 of the second substrate 270. In addition, the third region A3 of the second substrate 270 corresponding to the plurality of grooves GR may have a third thickness t3 smaller than the second thickness t2, and the other portions of the third region A3 may have the second thickness t2. The plurality of grooves GR may be uniformly spaced apart from each other by a predetermined distance. An absorbent material 280 such as barium oxide (BaO) or calcium oxide (CaO) are formed in each of the plurality of grooves GR of the third region A3 of the second substrate 270.

The first and second substrates 210 and 270 are attached with a seal pattern 290 such that the display area DA of the first substrate 210 faces the second region A2 of the second substrate 270. The seal pattern 290 is formed between the first and second substrates 210 and 270 in the first region A1.

In the organic ELD device 200 according to the exemplary second embodiment of the present invention, a protection layer 273 is formed in the second region A2 on an inner surface of the second substrate 270. The protection layer 273 is used as an etching mask film for the second region A2 while the second substrate 270 of the third region A3 is etched for forming the plurality of grooves GR. Since the etching mask film for forming the plurality of grooves GR in the second substrate 270 is used as the protection layer 273, the protection layer 273 is formed without an additional photolithographic process including deposition or coating.

The protection layer 273 includes a transparent material having excellent elasticity and excellent surface roughness. For example, the protection layer 273 may include one of acryl, polycarbonate, and poly-ethylene-terephthalate (PET). Although not shown in FIG. 7A, an adhesive may be formed between the second substrate 270 of the second region A2 and the protection layer 273.

Since the protection layer 273 is formed on the inner surface of the second substrate 270 in the second region A2, a protrusion formed from the etching step for the second region A2 is covered with the protection layer 273, and the inner surface of the second substrate 270 in the second region A2 is planarized by the protection layer 273. As a result, deterioration of the second electrode 260 due to the protrusion is prevented even when the second substrate 270 is bent by an external force. In addition, since the protection layer 273 has excellent elasticity, deterioration of the second electrode 260 is reduced even when the protection layer 273 contacts the second electrode 260.

Figure 8A:
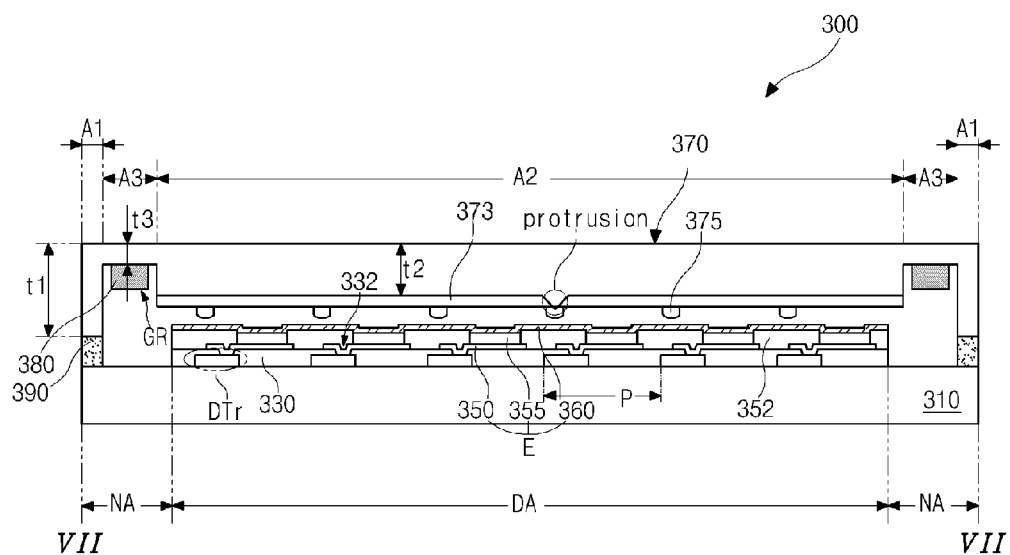
FIG. 8A is a cross-sectional view showing an organic ELD device according to an exemplary third embodiment of the present invention.
Figure 8B:
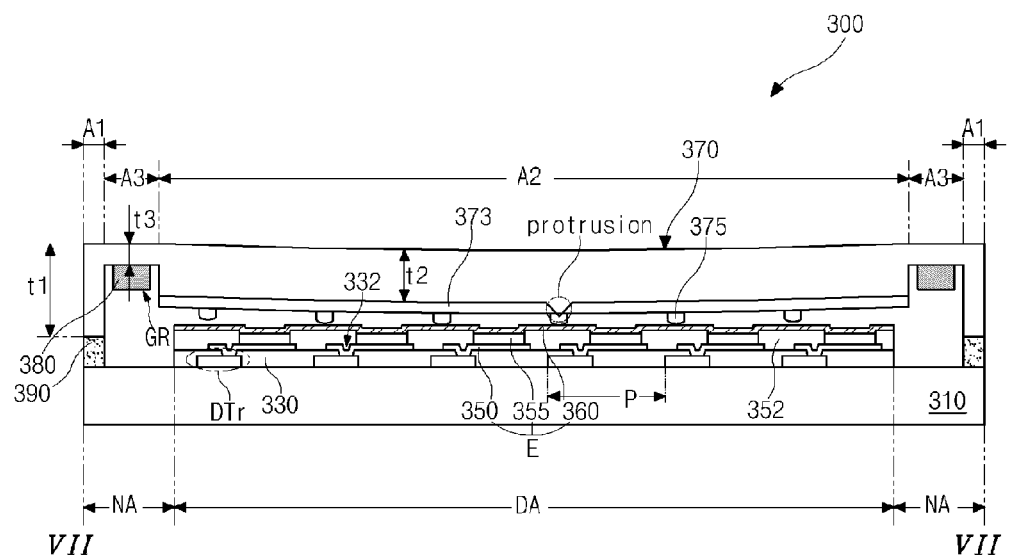
FIG. 8B is a cross-sectional view showing bending of a second substrate of an organic ELD device according to an exemplary third embodiment of the present invention.

FIG. 8A is a cross-sectional view showing an organic ELD device according to an exemplary third embodiment of the present invention, and FIG. 8B is a cross-sectional view showing bending of a second substrate of an organic ELD device according to an exemplary third embodiment of the present invention.

In FIGS. 8A and 8B, an organic ELD device 300 includes a first substrate 310 having a switching TFT (not shown), a driving thin film transistor (TFT) DTr, an organic electroluminescent diode E, and a second substrate 370 facing the first substrate 310. The second substrate 370 is used for encapsulating the first substrate 310. The first substrate 310 includes a display area DA and a non-display area NA surrounding the display area DA. A plurality of gate lines (not shown), a plurality of data lines, and a plurality of power lines (not shown) are formed in the display area DA on the first substrate 310. The plurality of gate lines cross the plurality of data lines to define a plurality of pixel regions P, and the plurality of power lines are spaced apart from the plurality of gate lines or the plurality of data lines. In addition, the switching TFT connected to the gate and data line, and the driving TFT DTr connected to the switching TFT STr, and the power line are formed in each pixel region P. A passivation layer 330 having a flat top surface is formed on the switching TFT and the driving TFT DTr, and a first electrode 350 is formed on the passivation layer 330 in each pixel region P. The passivation layer 330 includes a contact hole 332 exposing an electrode of the driving TFT DTr, and the first electrode 350 is connected to the electrode of the driving TFT DTr through the contact hole 332.

Further, a buffer pattern 352 is formed on the first electrode 350 at a boundary portion of each pixel region P. The buffer pattern 352 covers and overlaps edge portions of the first electrode 350. An organic luminescent layer 355 is formed on the first electrode 350 inside the buffer pattern 352, and a second electrode 360 is formed on the organic luminescent layer 355. The second electrode 360 may be formed in the whole display area DA as a single body. The first electrode 350, the organic luminescent layer 355, and the second electrode 360 constitute the organic electroluminescent diode E.

The organic luminescent layer 355 may be formed through a nozzle coating method or an inkjet method. Alternatively, the organic luminescent layer 355 may be formed through a thermal evaporation method using a shadow mask. Although not shown in FIGS. 8A and 8B, a plurality of spacers each having a bar shape may be formed on the buffer pattern 352 when the organic luminescent layer 355 is formed using the shadow mask. While the organic luminescent layer 355 is formed through the thermal evaporation method, the plurality of spacers support the shadow mask to prevent warpage of the shadow mask.

Elements such as link lines (not shown) and pads for connection to an external driving circuit (not shown) are formed in the non-display area NA of the first substrate 310. Although the passivation layer 330 is removed in the non-display area NA for improving contact property in FIGS. 8A and 8B, the passivation layer 330 may remain in the non-display area NA for protecting the elements such as the link lines.

The second substrate 370 includes a first region A1 corresponding to the non-display area NA, a second region A2 surrounded by the first region A1, and a third region A3 between the first and second regions A1 and A2. The second substrate 370 may include a transparent glass. The first region A1 of the second substrate 370 that is not etched may have a first thickness t1, and the second region A2 of the second substrate 370 that is etched once may have a second thickness t2 smaller than the first thickness t1. A plurality of grooves GR is formed in the third region A3 of the second substrate 370. In addition, the third region A3 of the second substrate 370 corresponding to the plurality of grooves GR may have a third thickness t3 smaller than the second thickness t2 and the other portions of the third region A3 may have the second thickness t2. The plurality of grooves GR may be uniformly spaced apart from each other by a predetermined distance. An absorbent material 380 such as barium oxide (BaO) or calcium oxide (CaO) are formed in each of the plurality of grooves GR of the third region A3 of the second substrate 370.

The first and second substrates 310 and 370 are attached with a seal pattern 390 such that the display area DA of the first substrate 310 faces the second region A2 of the second substrate 370. The seal pattern 390 is formed between the first and second substrates 310 and 370 in the first region A1.

In the organic ELD device 300 according to an exemplary third embodiment of the present invention, a protection layer 373 is formed in the second region A2 on an inner surface of the second substrate 370, and a plurality of protection patterns 375 each having a bar shape are formed on the protection layer 373. One of the protection layer 373 and the plurality of protection patterns 375 may include one of an organic insulating material, such as photo acryl and benzocyclobutene (BCB), and an inorganic insulating material, such as silicon nitride (SiNx) and silicon oxide ($SiO_2$). The protection layer 373 may have a thickness of about 2 μm to about 3 μm and each of the plurality of protection patterns 375 may have a height of about 1 μm to about 2 μm. In addition, the plurality of protection patterns 375 may be parallel to and spaced apart from each other. When the plurality of spacers are formed on the buffer pattern 352 over the first substrate 310, the plurality of protection patterns 375 may be formed to be perpendicular to the plurality of spacers. Alternatively, the protection layer 373, including one of an organic or inorganic insulating material, is formed on the inner surface of the second substrate 370, and the plurality of protection patterns 375 may be omitted.

Since the protection layer 373 is formed on the inner surface of the second substrate 370 in the second region A2, a protrusion formed from the etching step for the second region A2 is covered with the protection layer 373, and the inner surface of the second substrate 370 in the second region A2 is planarized by the protection layer 373. As a result, deterioration of the second electrode 360 due to the protrusion is prevented even when the second substrate 370 is bent by an external force. In addition, since the protection layer 373 has excellent elasticity, deterioration of the second electrode 360 is reduced even when the protection layer 373 contacts the second electrode 360.

Further, when the plurality of protection patterns 375 are formed on the protection layer 373, deterioration due to a protrusion having a height of about 4 μm to about 5 μm is prevented by the plurality of protection patterns 375. Since the protrusion is disposed between the adjacent two protection patterns 375 or covered with one of the plurality of protection patterns 375, the plurality of protection patterns 375 contact the second electrode 360 when the second substrate 370 is bent by an external force. As a result, breakage of the second electrode 360 and electric shortage of the first and second electrodes 310 and 360 are prevented.

Moreover, in an organic ELD device where the plurality of spacers are formed on the buffer pattern 352 over the first substrate 310 and the plurality of protection patterns 375 perpendicular to the plurality of spacers are formed on the second substrate 360, the plurality of protection patterns 375 contact the plurality of spacers when the second substrate 360 is bent by an external force. As a result, contact area is minimized and deterioration due to the protrusion is more stably prevented by the height of each spacer.

FIGS. 9A to 9F are cross-sectional views showing a method of fabricating an organic ELD device according to an exemplary fourth embodiment of the present invention.

Figure 9A:
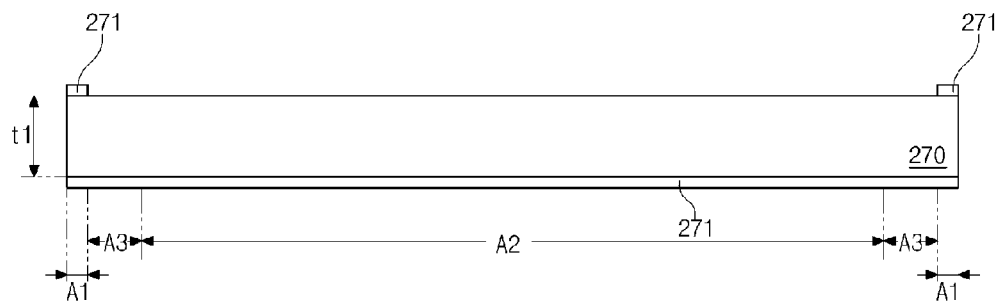
FIGS. 9A to 9F are cross-sectional views showing a method of fabricating an organic ELD device according to an exemplary fourth embodiment of the present invention.

In FIG. 9A, after a first etching mask film 271 is formed on each of first and second surfaces of a substrate 270, having first, second, and third regions A1, A2, and A3, portions of the first etching mask film 271 corresponding to the second and third regions A2 and A3 are removed from the first surface of the second substrate 270. As a result, the first etching mask film 271 is formed on the first surface of the second substrate 270 corresponding to the first region A1 and the first surface of the second substrate 270 corresponding to the second and third regions A2 and A3 are exposed through the first etching mask film 271. In addition, the first etching mask film 271 is formed on the whole second surface of the second substrate 270.

The second substrate 270 may be formed of a transparent glass and have a first thickness t1. Further, the first etching mask film 271 may be formed of a transparent material such as acryl, polycarbonate, and poly-ethylene-terephthalate (PET) through a transcribing method, and an adhesive (not shown) may be formed between the first etching mask film 271 and the second substrate 270. The first and second regions A1 and A2 correspond to center and boundary portions, respectively, of the second substrate 270, and the third region A3 is disposed between the first and second regions A1 and A2.

Figure 9B:
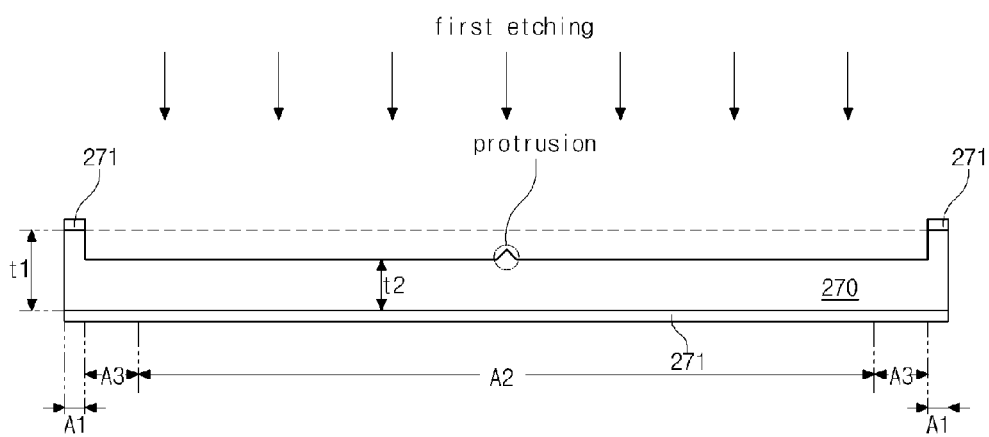

In FIG. 9B, a first etching step using the first etching mask film 271 as an etching mask is performed for the second substrate 270. For example, the second substrate 270 may be etched with an etching solution such as hydrofluoric acid (HF) through a spraying method or a dipping method. As a result, the second substrate 270 exposed through the first etching mask film 271 is etched, and the second substrate 270 corresponding to the second and third regions A2 and A3 has a second thickness t2 smaller than the first thickness t1. After the first etching step, a plurality of protrusions may be formed on the first surface of the second substrate 270 due to partial etching difference.

Figure 9C:
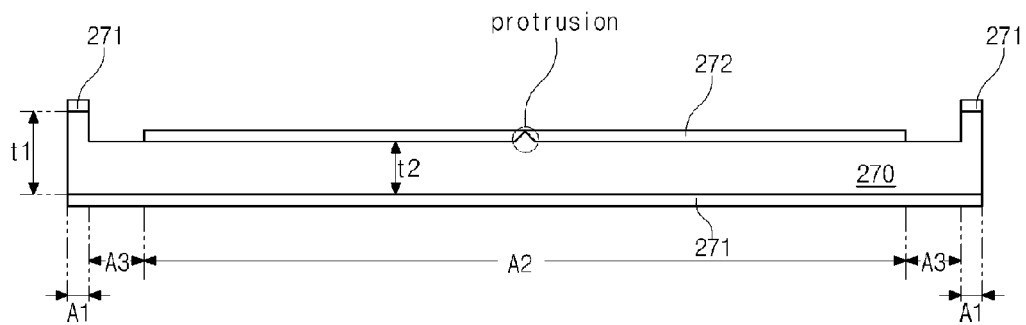

In FIG. 9C, a second etching mask film 272 is formed on the first surface of the second substrate 270 corresponding to the second region A2 and portions of the third region A3 where a plurality of grooves GR (of FIG. 9D) are not formed in a subsequent process. For example, the second etching mask film 272 may be attached to the first surface using an adhesive. As a result, the first etching mask film 271 is formed on the first surface of the second substrate 270 corresponding to the first region A1. The first etching mask film 271 is formed on the whole second surface of the second substrate 270. Also, the second etching mask 272 is formed on the first surface of the second substrate 270 corresponding to the second region A2 and the portions of the third region A3 where the plurality of grooves GR are not formed in a subsequent process. Meanwhile, the first surface of the second substrate 270 corresponding to the portions of the third region A3 where the plurality of grooves GR are formed in a subsequent process is exposed through the first and second etching mask films 271 and 272.

Alternatively, the first etching mask film 271 on the first surface of the second substrate 270 corresponding to the first region A1 may be removed after the first etching step and the second etching mask film 272 may be formed on the first surface of the second substrate 270 corresponding to the first region A1.

Figure 9D:
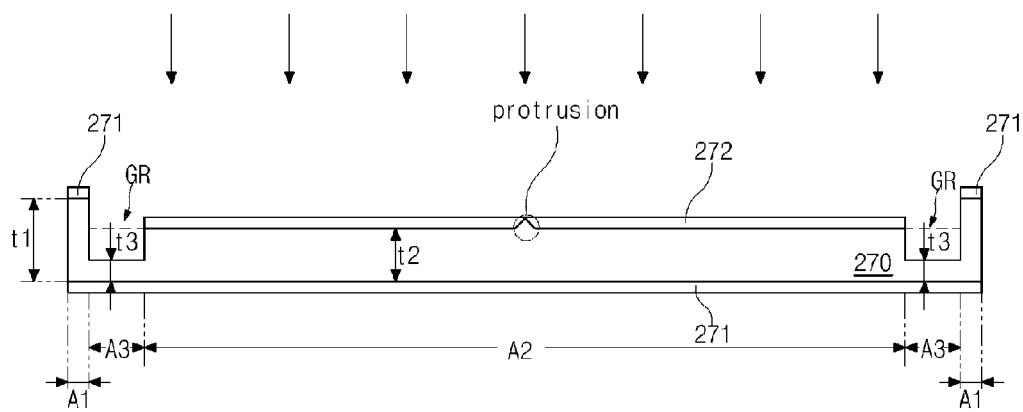

In FIG. 9D, a second etching step using the first and second etching mask films 271 and 272 as an etching mask is performed for the second substrate 270. For example, the second substrate 270 may be etched with an etching solution such as hydrofluoric acid (HF) through a spraying method or a dipping method. As a result, the second substrate 270 exposed through the first and second etching mask films 271 and 272 is etched to form the plurality of grooves GR in the third region A3, and the second substrate 270 corresponding to the plurality of grooves GR in the third region A3 has a third thickness t3 smaller than the second thickness t2.

Figure 9E:
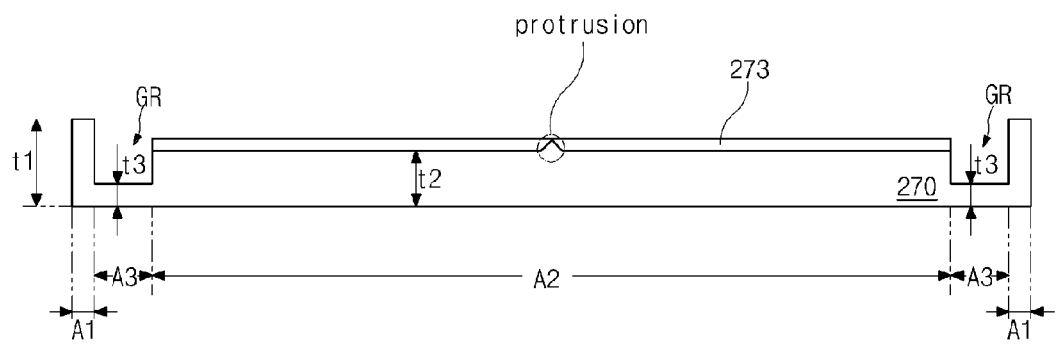

In FIG. 9E, the first etching mask film 271 is removed from the first surface of the second substrate 270 corresponding to the first region A1 and the second surface of the second substrate 270, and the second etching mask film 272 remains on the first surface of the second substrate 270 corresponding to the second region A2 and the portions of the third region A3 where the plurality of grooves GR is not formed. Accordingly, the second substrate 270 has the first thickness t1 at the first region A1, the second thickness t2 at the second region A2 and the portions of the third region A3 where the plurality of grooves GR are not formed, and the third thickness t3 at the plurality of grooves GR of the third region A3. In addition, the second etching mask film 272 in the second region A2 remains to become the protection layer 273 (of FIGS. 6, 7A, and 7B) covering the plurality of protrusions and preventing deterioration due to the plurality of protrusions.

Figure 9F:
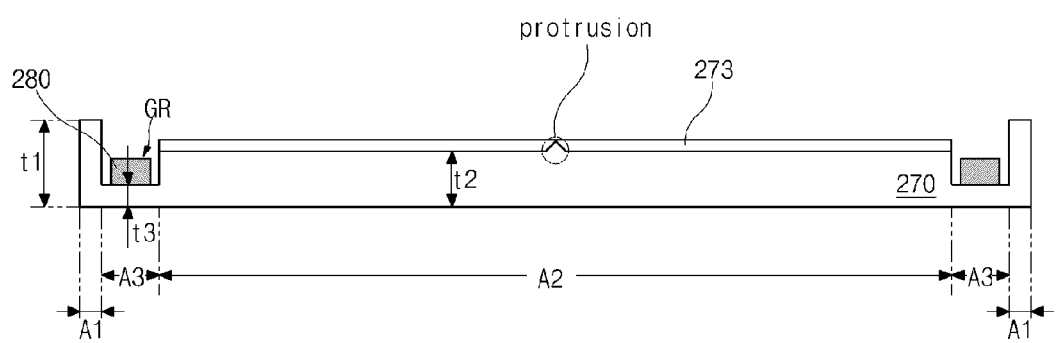

In FIG. 9F, an absorbent material 280 is formed in the plurality of grooves GR. Referring to the organic ELD device 100 (of FIGS. 3 and 4) according to the exemplary first embodiment of the present invention, the second etching mask film may be removed and the absorbent material may be formed in the plurality of grooves after the second substrate 170 (of FIGS. 3 and 4) is fabricated through the steps of FIGS. 9A to 9E.

FIGS. 10A to 10E are cross-sectional views showing a method of fabricating an organic electroluminescent display device according to an exemplary fifth embodiment of the present invention.

Figure 10A:
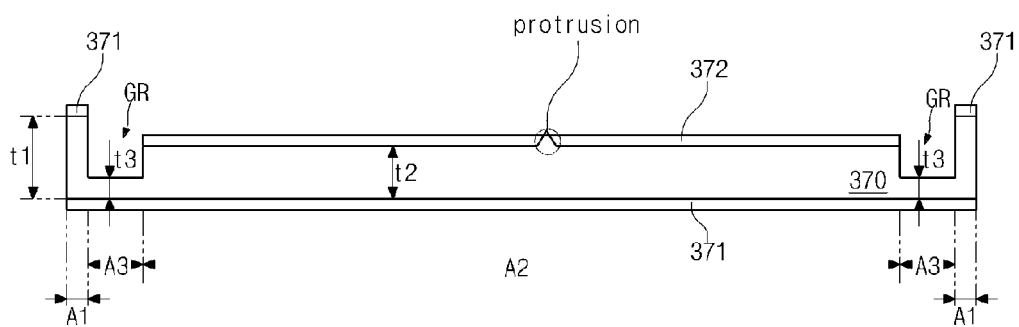
FIGS. 10A to 10E are cross-sectional views showing a method of fabricating an organic ELD device according to an exemplary fifth embodiment of the present invention.

In FIG. 10A, a second substrate 370 having first, second, and third thicknesses t1, t2, and t3 is fabricated through steps similar to those shown in FIGS. 9A to 9E. The first thickness t1 corresponds to a first region A1, and the second thickness t2 corresponds to a second region A2 and portions of a third region A3 where a plurality of grooves GR are not formed. In addition, the third thickness t3 corresponds to the plurality of grooves GR. A first etching mask film 371 is formed on a first surface of the second substrate 370 in the first region A1 and a whole second surface of the second substrate 370, and a second etching mask film 372 is formed on the first surface of the second substrate 370 in the second region A2. A plurality of protrusions on the first surface of the second substrate 370 in the second region A2 are covered with the second etching mask film 372.

Figure 10B:
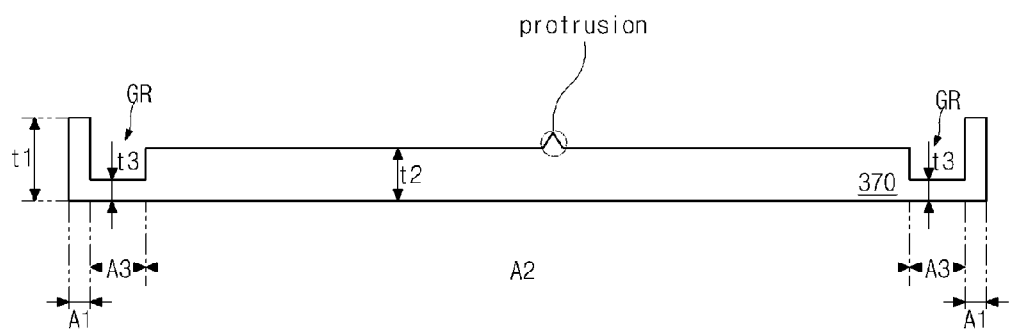

In FIG. 10B, the first and second etching mask films 371 and 372 are removed from the second substrate 370. As a result, the first surface and the second surface including the plurality of protrusions of the second substrate 370 are exposed.

Figure 10C:
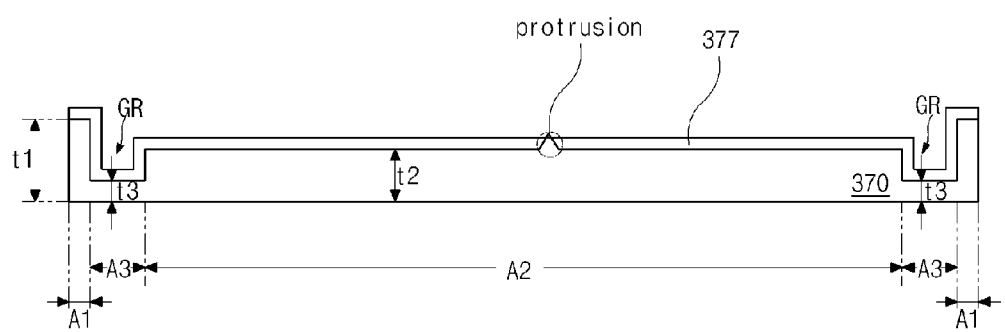

In FIG. 10C, a first insulating material layer 377 is formed on the whole first surface of the second substrate 370 by coating an organic insulating material or depositing an inorganic insulating material.

Figure 10D:
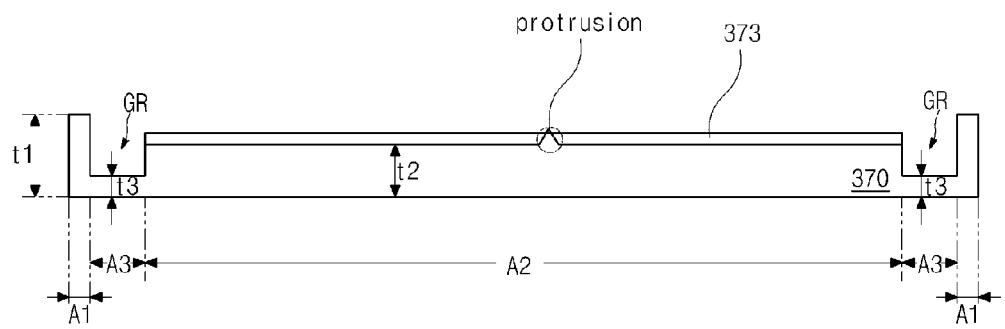

In FIG. 10D, the first insulating material layer 377 is patterned to form a protection layer 373 on the first surface of the second substrate 370 in the second region A2. For example, the first insulating material layer 377 corresponding to the first and third regions A1 and A3 may be removed, and the first insulating material layer 377 corresponding to the second region A2 may remain. As a result, the protection layer 373 covers the plurality of protrusions of the second substrate 370.

Figure 10E:
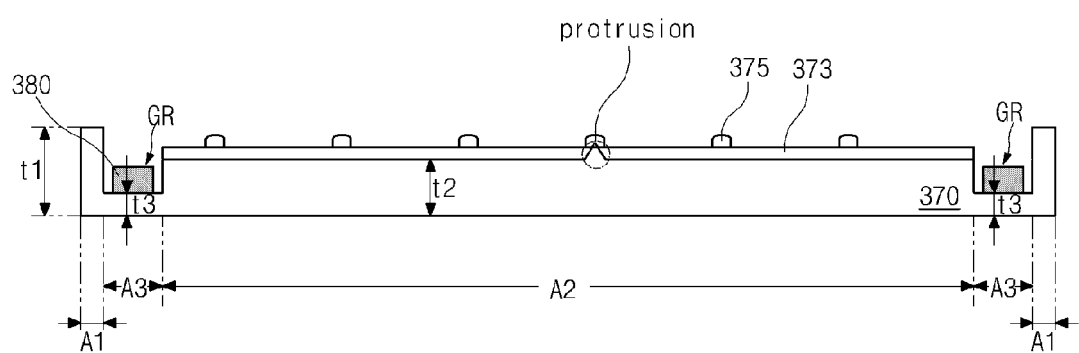

In FIG. 10E, after a second insulating material layer (not shown) is formed on the protection layer 373, the second insulating material is patterned to form a plurality of protection patterns 375 on the protection layer 373. For example, the second insulating material layer may be formed by coating an organic insulating material or depositing an inorganic insulating material. In addition, each of the plurality of protection patterns 375 may have a bar shape, and the plurality of protection patterns 375 may be parallel to and spaced apart from each other. After the plurality of protection patterns 375 are formed, an absorbent material 380 is formed in the plurality of grooves GR in the third region A3.

Alternatively, the plurality of protection patterns 375 may be omitted. In yet another alternative, the protection layer 373 and the plurality of protection patterns 375 may be formed through a single mask process including a coating step of an insulating material, an exposure step using a photo mask having a blocking area, a half-transmissive area, and a transmissive area and a patterning step.

Moreover, first substrates of organic ELD devices according to first to third embodiments of the present invention may be fabricated through the same method. For example, a gate line and a data line with an interposed insulating layer are formed on a first substrate 110 (of FIG. 4). A power line parallel to and spaced apart from one of the gate line and the data line is formed on the first substrate 110. In addition, a switching thin film transistor (TFT) connected to the gate line and the data line and a driving TFT DTr (of FIG. 4) connected to the switching TFT and the power line are formed on the first substrate 110. Next, a passivation layer 130 is formed on the switching TFT and the driving TFT DTr. The passivation layer 130 includes a contact hole 132 (of FIG. 4) exposing an electrode of the driving TFT DTr.

Next, a first electrode 150 is formed on the passivation layer 130. The first electrode 150 is connected to the electrode of the driving TFT DTr through the contact hole 132 and disposed in each pixel region P (of FIG. 4). Next, a buffer pattern 152 is formed on the first electrode 150. The buffer pattern 152 is disposed at a boundary portion of the pixel regions P to cover and overlap edge portions of the first electrode 150. Next, a plurality of spacers each having a bar shape may be formed on the buffer pattern 152 based on a subsequent step of forming an organic luminescent layer 155. Next, the organic luminescent layer 155 is formed on the first electrode in the pixel region P. The organic luminescent layer 155 may be formed through one of a nozzle coating method, an inkjet method, and a thermal evaporation method using a shadow mask. Next, a second electrode 160 is formed on the organic luminescent layer 155. The second electrode 160 may be disposed as a single body in a whole display area DA (of FIG. 4).

After the first and second substrates 110 and 170 are fabricated, the first and second substrates 110 and 170 are disposed to face each other. Next, a seal pattern 190 is formed between the first and second substrates 110 and 170 corresponding to the first region A1, and the first and second substrates 110 and 170 are attached such that the organic electroluminescent diode E (of FIG. 4) of the first substrate 110 faces the first surface of the second substrate 170, thereby an organic electroluminescent display device completed. For example, the first and second substrates may be attached in an environment such as an inert gas ambient and a vacuum.

In an organic ELD device, the light may be emitted upwardly and the organic ELD device may have a top emission type since an absorbent material is disposed at a non-display area. In addition, deterioration of the substrate for encapsulation such as a break or crack of the substrate for encapsulation is prevented since a plurality of grooves having the absorbent material are formed in a boundary portion of a substrate for encapsulation and a central portion of the substrate for encapsulation is thicker than the boundary portion. Further, deterioration of the organic ELD device due to bending of the substrate for encapsulation, such as the breakage of the second electrode of the organic electroluminescent diode and electric shortage of the first and second electrodes the organic electroluminescent diode, is prevented since a protection layer is formed on the substrate for encapsulation.

It will be apparent to those skilled in the art that various modifications and variations can be made in the organic electroluminescent display device and the method of fabricating the same of the present invention without departing from the sprit or scope of the invention. Thus, it is intended that the present invention covers the modifications and variations of this invention provided they come within the scope of the appended claims and their equivalents.

What is claimed is:

1. An organic electroluminescent display device comprising:
a first substrate including a display area and a non-display area surrounding the display area;
an organic electroluminescent diode in the display area on the first substrate;
a second substrate facing and spaced apart from the first substrate, the second substrate including a first region corresponding to the non-display area, a second region corresponding to the display area and a third region between the first and second region, wherein the second substrate includes a plurality of grooves in the third region, and wherein the second substrate has a first thickness in the first region, a second thickness smaller than the first thickness in the second region and a third thickness smaller than the second thickness in a portion of the third region where the plurality of grooves are formed;
a protection layer in the second region on the second substrate; and
a seal pattern in the first region between the first and second substrates.

2. The organic electroluminescent display device according to claim 1 further comprising an absorbent material in each of the plurality of grooves.

3. The organic electroluminescent display device according to claim 1 further comprising a plurality of protection patterns.

4. The organic electroluminescent display device according to claim 1 wherein the protection layer is on an inner surface of the second substrate.

5. The organic electroluminescent display device according to claim 1 wherein the protection layer has a thickness between 2 μm and 3 μm.

6. The organic electroluminescent display device according to claim 3 wherein each of the plurality of protection patterns has a thickness between 1 μm and 2 μm.

7. The organic electroluminescent display device according to claim 1 wherein the protection layer includes one of acryl, polycarbonate, and poly-ethylene-terephthalate.

* * * * *